United States Patent
Zingher et al.

(10) Patent No.: US 7,397,136 B2
(45) Date of Patent: Jul. 8, 2008

(54) MULTI-CHIP MODULE AND SINGLE-CHIP MODULE FOR CHIPS AND PROXIMITY CONNECTORS

(75) Inventors: Arthur R. Zingher, Mountain View, CA (US); Bruce M. Guenin, San Diego, CA (US); Edward L. Follmer, Del Mar, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 566 days.

(21) Appl. No.: 11/183,047

(22) Filed: Jul. 15, 2005

(65) Prior Publication Data

US 2006/0017150 A1 Jan. 26, 2006

Related U.S. Application Data

(60) Provisional application No. 60/591,572, filed on Jul. 26, 2004.

(51) Int. Cl.
*H01L 23/48* (2006.01)
*H01L 23/52* (2006.01)
*H01L 29/14* (2006.01)

(52) U.S. Cl. ................ 257/784; 257/773
(58) Field of Classification Search .......... 257/666, 257/784, 691, 773, 777, 532, 723, 724
See application file for complete search history.

(56) References Cited

U.S. PATENT DOCUMENTS

| | | | |
|---|---|---|---|
| 3,596,228 A * | 7/1971 | Reed et al. ............ 439/513 |
| 5,629,838 A | 5/1997 | Knight et al. ............ 361/782 |
| 6,559,531 B1 | 5/2003 | Sutherland ............ 257/686 |
| 6,728,113 B1 | 4/2004 | Knight et al. ............ 361/760 |
| 6,916,719 B1 * | 7/2005 | Knight et al. ............ 438/381 |
| 6,930,494 B2 * | 8/2005 | Tesdahl et al. ............ 324/690 |
| 7,064,566 B2 * | 6/2006 | Khandros et al. ............ 324/754 |
| 2003/0042602 A1 | 3/2003 | Drost ............ 257/723 |
| 2003/0080438 A1 * | 5/2003 | Matsuura et al. ............ 257/778 |
| 2003/0224553 A1 * | 12/2003 | Manansala ............ 438/106 |
| 2004/0021211 A1 | 2/2004 | Damberg ............ 257/686 |
| 2004/0029411 A1 * | 2/2004 | Rathburn ............ 439/66 |
| 2006/0043562 A1 * | 3/2006 | Watanabe ............ 257/686 |
| 2006/0195024 A1 * | 8/2006 | Benni ............ 600/323 |
| 2007/0025079 A1 * | 2/2007 | Salmon ............ 361/688 |
| 2007/0205479 A1 * | 9/2007 | Dangel et al. ............ 257/432 |
| 2008/0017971 A1 * | 1/2008 | Hollis ............ 257/698 |

* cited by examiner

*Primary Examiner*—S. V Clark
(74) *Attorney, Agent, or Firm*—Park, Vaughan & Fleming LLP

(57) ABSTRACT

A single-chip module is described. The module includes a first semiconductor die having a first surface and a second surface. The first semiconductor die is configured to communicate by capacitive coupling using one or more of a plurality of proximity connectors coupled to the first semiconductor die. A cable coupled to the first semiconductor die is configured to couple power signals to the first semiconductor die. A flexibility compliance of at least one section of the cable is greater than a threshold value thereby allowing the module to be positioned in a mounting structure.

21 Claims, 11 Drawing Sheets

900

Remove One or More Single-Chip Modules From a Multi-Chip Module
910

Replaceably Attach One or More Single-Chip Modules to the Multi-Chip Module
912

MULTI-CHIP MODULE AND SINGLE-CHIP MODULE FOR CHIPS AND PROXIMITY CONNECTORS

CROSS REFERENCE TO RELATED APPLICATIONS

This application claims priority under 35 U.S.C. 119(e) to U.S. Provisional Application Ser. No. 60/591,572, filed on Jul. 26, 2004, the contents of which are herein incorporated by reference.

BACKGROUND

1. Field of the Invention

The present invention relates to packaging techniques for semiconductor dies. More specifically, the present invention relates to single-chip and multi-chip modules for semiconductor dies that communicate signals using proximity connections.

2. Related Art

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit data signals directly from the first chip to the second chip without having to route the data signals through intervening signal lines within a printed circuit board.

Capacitive coupling depends on a relative position of the transmitter pads and the receiver pads, both in a plane defined by the pads and in a direction perpendicular to the plane. Misalignment in the plane may cause each receiving pad to span two transmitting pads, thereby destroying a received signal. In theory, satisfactory communication requires alignment such that misalignment is less than half of a pitch between the pads. In practice, the alignment requirements may be more stringent. In addition, limiting overall misalignment may improve communication performance between the chips and reduce power consumption.

Unfortunately, it is not a simple matter to align the chips properly using existing mounting structures, such as conventional single-chip modules or conventional multi-chip modules. The chips in these structures are subject to thermal expansion and mechanical vibrations, as well as manufacturing and assembly perturbations that result in misalignment problems.

What is needed is needed are single-chip modules and multi-chip modules and methods for chips and proximity connectors to facilitate capacitive inter-chip communication without the problems listed above.

SUMMARY

A single-chip module is described. The module includes a first semiconductor die having a first surface and a second surface. The first semiconductor die is configured to communicate by capacitive coupling using one or more of a plurality of proximity connectors coupled to the first semiconductor die. A cable coupled to the first semiconductor die is configured to couple power signals to the first semiconductor die. A flexibility compliance of at least one section of the cable is greater than a threshold value thereby allowing the module to be positioned in a mounting structure.

The first semiconductor die may have the plurality of proximity connectors proximate to the first surface. One or more of the plurality of proximity connectors may enable communication of data signals by capacitive coupling.

The cable may be coupled to the first surface of the first semiconductor die. A capacitor may be coupled to the cable such that the cable is sandwiched between the capacitor and the first surface of the first semiconductor die. A capacitance C between the capacitor and a ground and an inductance L of the cable may result in an LC time constant substantially less than 1 ns.

The cable may include at least two multilayer elements. Each multilayer element may include a first metal layer, a dielectric layer and a second metal layer. Each multilayer element may constitute a transmission line. At least the two multilayer elements may be mechanically independent in at least the one section of the cable having the flexibility compliance greater than the threshold value. At least the two multilayer elements may include stiffener elements in at least another section of the cable resulting in the flexibility compliance that is less than the threshold value.

The first semiconductor die may have substantially symmetric layers deposited on the first surface and the second surface resulting in a substantially 4-fold symmetry that reduces perturbation-induced quadrapole mechanical deviations of the first semiconductor die from a plane parallel to the first surface below a pre-determined value.

The single-chip mounting structure may include a pedestal coupled to the second surface of the first semiconductor die via a thermal joint.

In some embodiments, the first semiconductor die may include at least three lithographically defined alignment features. The alignment features may correspond to the mounting structure such that the module may be positioned in the mounting structure relative to additional proximity connectors with a deviation in a first dimension in a plane of the first surface of the first semiconductor die that is less than one half of a pitch of at least a subset of the plurality of the proximity connectors along the first dimension, and the deviation in a second dimension perpendicular to the plane of the first surface of the first semiconductor die that is less than the pre-determined value.

The single-chip module may be further positioning in the mounting structure relative to the additional proximity connectors such that the deviation in a third dimension in the plane of the first surface of the first semiconductor die is less than one half of the pitch of at least the subset of the plurality of the proximity connectors along the third dimension.

In some embodiments, the single-chip module may include a second semiconductor die electrically and thermally coupled to the first surface of the first semiconductor die. The second semiconductor die may have substantially symmetric layers deposited on both of its surfaces resulting in a substantially 4-fold symmetry that reduces perturbation-induced quadrapole mechanical deviations of the second semiconductor die from a plane parallel to the first surface of the first semiconductor die below the pre-determined value.

BRIEF DESCRIPTION OF THE FIGURES

Like reference numerals refer to corresponding parts throughout the drawings.

DETAILED DESCRIPTION

Figure 1A:
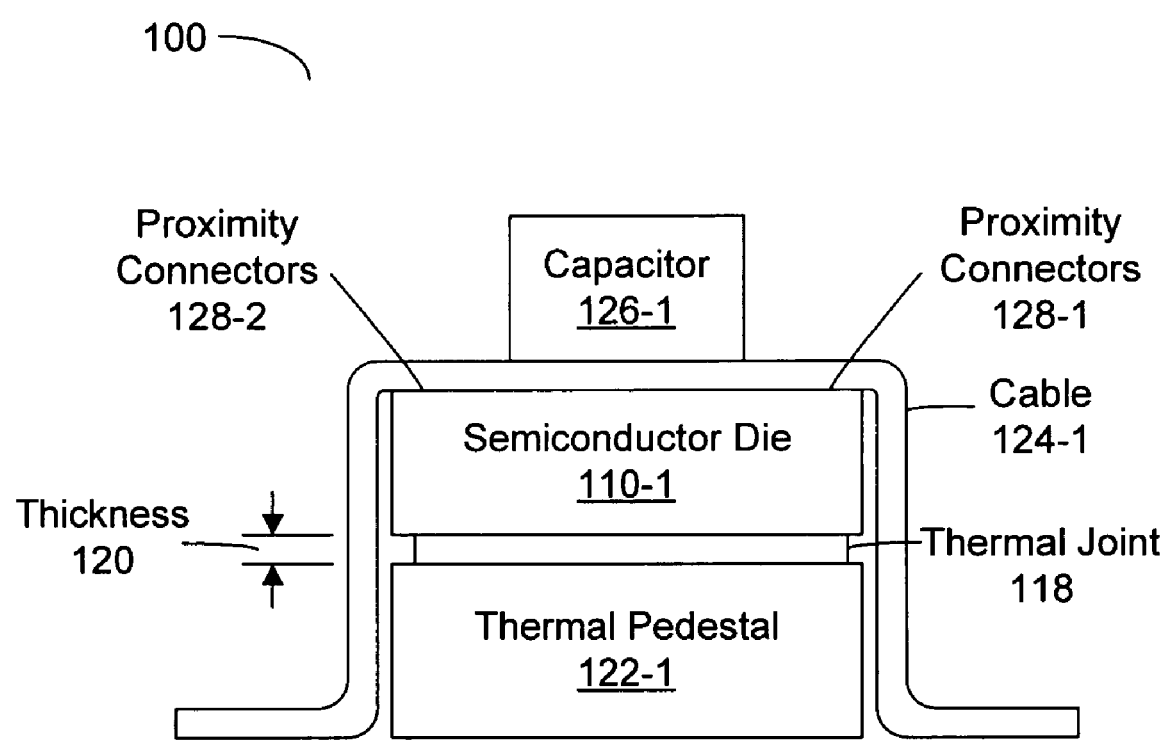
FIG. 1A is a block diagram illustrating an embodiment of a single-chip module.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a single-chip module (SCM) and a multi-chip module (MCM) are disclosed. The SCM and the MCM represent solutions to numerous, coupled packaging challenges. The SCM includes one or more semiconductor dies. A semiconductor die includes integrated circuit electronics corresponding to layers deposited on a semiconductor substrate. When packaged, for example in the SCM, the one or more semiconductor dies is sometimes referred to as a chip. The MCM is well-suited for mounting two or more SCMs with limited misalignment, i.e., substantially accurate alignment, thereby enabling communication of data signals between the two or more SCMs using proximity connectors. In some embodiments, the MCM may reliably and economically align two or more proximity connectors in a first dimension (X), a second dimension (Y), and/or a third dimension (Z) within a few microns. In some embodiments, the MCM may be aligned in six degrees of freedom, including the first dimension (X), the second dimension (Y), the third dimension (Z), an angle in a plane defined by the first dimension (X) and the second dimension (Y), an angle in a plane defined by the first dimension (X) and the third dimension (Z), and an angle in a plane defined by the second dimension (Y) and the third dimension (Z). This capability may be of use for densely packed proximity connectors, i.e., connectors having a small spacing or pitch between adjacent pads.

The proximity connectors may utilize capacitive coupling, which may increase a bandwidth and/or a number of data signal channels for inter-chip communication. In some embodiments, at least one of the semiconductor dies in an SCM is coupled to a plurality of proximity connectors. In some embodiments, at least one of the semiconductor dies in an SCM includes a plurality of proximity connectors proximate to a surface. In exemplary embodiments, the plurality of proximity connectors are substantially located at one or more corners of a respective semiconductor die. The MCM may be configured to position the two or more SCMs to enable capacitive coupling between one or more overlapped proximity connectors on adjacent semiconductor dies.

Substantially accurate alignment may be provided using self-alignment, self-adjustment and/or self-balancing of the components in the MCM. Narrow tolerances and precise manufacturing of most or all of the components may not be needed. In addition, precise assembly may not be needed. Moderate forces between the components and small movements of the components may counteract thermal distortions, mechanical vibrations, external forces, fabrication tolerances and assembly perturbations that result in misalignment problems.

The MCM may also provide electrical power to and help remove corresponding dissipated heat from the SCMs without perturbing the SCM alignment. In embodiments with multiple SCMs, the MCM may provide a large power per unit area. In addition, there may be a large power per MCM. Connections to the SCMs in each MCM may have low resistance and low inductance. Dissipated heat may be removed from the respective SCM over a moderate temperature drop.

In some embodiments, one or more SCM may undergo full burn-in testing, including a range of frequencies, a range of power, a range of functionality and/or accelerated testing, prior to assembly in the MCM. In some embodiments, the SCMs may be replaceably attached in the MCM. This allows one or more of the SCMs to be reworked, i.e., connected, later disconnected, and then re-connected again. As a consequence, one or more SCM may be removed from the MCM and one or more substitute SCMs may be inserted in their place. The ability to perform full burn-in testing and replace one or more chips in the MCM represents a solution to what is classically described as the "Known Good Die Problem."

The SCM and MCM may adapt materials, processes and tools that are known in the art in order to improve feasibility, i.e., to reduce expenses associated with manufacturing and assembly of the SCM and the MCM.

Single-Chip Module

FIG. 1A illustrates an embodiment of a single-chip module (SCM) 100. The SCM 100 includes a first semiconductor die 110 having a first surface and a second surface. In some embodiments, the first semiconductor die 110 may include a plurality of proximity connectors 128 located on and/or proximate to the first surface. For example, the plurality of proximity connectors 128 may be situated beneath a protective layer such that they are located below the first surface. While the SCM 100 illustrates the plurality of proximity connectors substantially located at one or more corners of the first semiconductor die 110, in other embodiments the plurality of proximity connectors 128 may be situated at an arbitrary location(s) on and/or proximate to the first surface. In other embodiments, the plurality of proximity connectors 128 may be coupled to the first semiconductor die 110, for example, using a cable. One or more of the plurality of proximity connectors 128 may enable communication of data signals by capacitive coupling. The first semiconductor die 110 may also include wiring and electronics to relay the data signals to a center of the semiconductor die were there may be additional electronics such as logic and/or a cache.

The first semiconductor die 110 may be coupled to a cable 124. In some embodiments, the cable 124 may be coupled to the first surface. In other embodiments, the cable 124 may be coupled to terminals located in several different planes substantially parallel to the first surface. The cable 124 may couple electrical power signals, such as positive and negative currents, to the first semiconductor die 110. A flexibility compliance of at least one section of the cable 124 may be greater than a threshold value. In addition, the flexibility compliance of at least another section of the cable 124 may be less than the threshold value. Thus, the cable 124 may have substantially flexible and substantially rigid sections. In some embodiments, the cable 124 may be a semi-flexible flat cable. As discussed further below with reference to FIG. 8, the flexibility compliance of at least the one section of the cable 124 may allow the SCM 100 to be accurately positioned in a mounting structure.

The cable 124 may have a low DC resistance, a low inductance and a low AC impedance. The cable 124 may have the DC resistance less than 0.5 μΩ and the AC impedance less than 25 μΩ at frequencies up to 3 GHz. In some embodiments, the cable 124 may also couple monitoring signals having frequencies up to 10 MHz into the SCM 100. This is discussed further below with reference to FIG. 5.

A decoupling capacitor 126 may be coupled to the cable 124 such that the cable 124 is sandwiched between the capacitor 126 and the first surface of the first semiconductor die 110. A capacitance C between the capacitor 126 and a ground and an inductance L of the cable 124 may result in an LC time constant substantially less than 1 ns. The cable 124 and the capacitor 126 may distribute electrical power to the first semiconductor die 110 and thereby partly bypass resistance and inductance of metal layers on the first semiconductor die 110.

In some embodiments, the SCM 100 may include a thermal pedestal 122 coupled to the second surface of the first semiconductor die 110 via a thermal joint 118. The thermal pedestal 122 may be a material with a high thermal conductivity. The thermal pedestal 122 may be copper or a material with a thermal expansion coefficient similar to that of the first semiconductor die 110. The thermal joint 118 has an average thickness 120. The thermal joint 118 may include a solder (such as lead-tin, indium or other alloys), a shearable layer of oil, a thermal paste and/or a coating that reduces static friction. Additional teaching regarding the thermal joint is provided in U.S. Pat. No. 5,291,271, the contents of which are herewith incorporated by reference.

Figure 2:
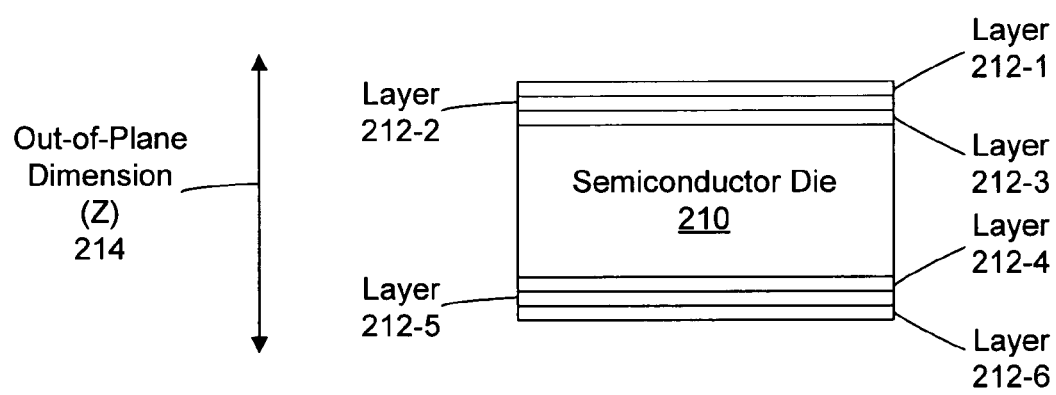
FIG. 2 is a block diagram illustrating a cross-sectional view of an embodiment of a semiconductor die.

In an exemplary embodiment, the thermal joint 118 may use a re-flowed solder, i.e., a solder that is melted and the solidified, to relieve initial perturbations associated with assembly of the SCM 100 and/or to fill large gaps. The re-flowed solder may also compensate for non-planarity of the semiconductor die 110. The re-flowed solder may have high-quality surfaces without so-called solder skin and/or air gaps. The re-flowed solder may have a thickness of 25 μm corresponding to the thickness 120. The thermal joint 118 may also include one or more thin layers that are permanently shearable, such as a micron-thin layer of oil and/or an ultra-thin (thickness less than 1 μm) anti-adhesion coating on at least one surface in the thermal joint 118. This may allow perturbations, such as thermal distortions, in the plane of the first surface of the first semiconductor die 110 to be reduced thereby enabling self-alignment and self-adjustment. Alternatively, the thermal joint 118 may include a thermal paste with grains of metal or liquid metal having a diameter that is less than a desired tolerance in an out-of-plane dimension (Z) 214 (FIG. 2).

In some embodiments, the thermal pedestal 122 may be rigidly bonded to the first semiconductor die 118. While this may help reduce heat spreading, a substantial heat flux may conduct through the thermal pedestal 122. This may result in key-stone shaped thermal distortion. Therefore, if the thermal pedestal 122 is bonded to the first semiconductor die 118 misalignment may result. The embodiments having loose mechanical coupling in the thermal joint 118, described in the preceding paragraph, represent a tradeoff between thermal conduction and flexibility compliance.

Figure 1B:
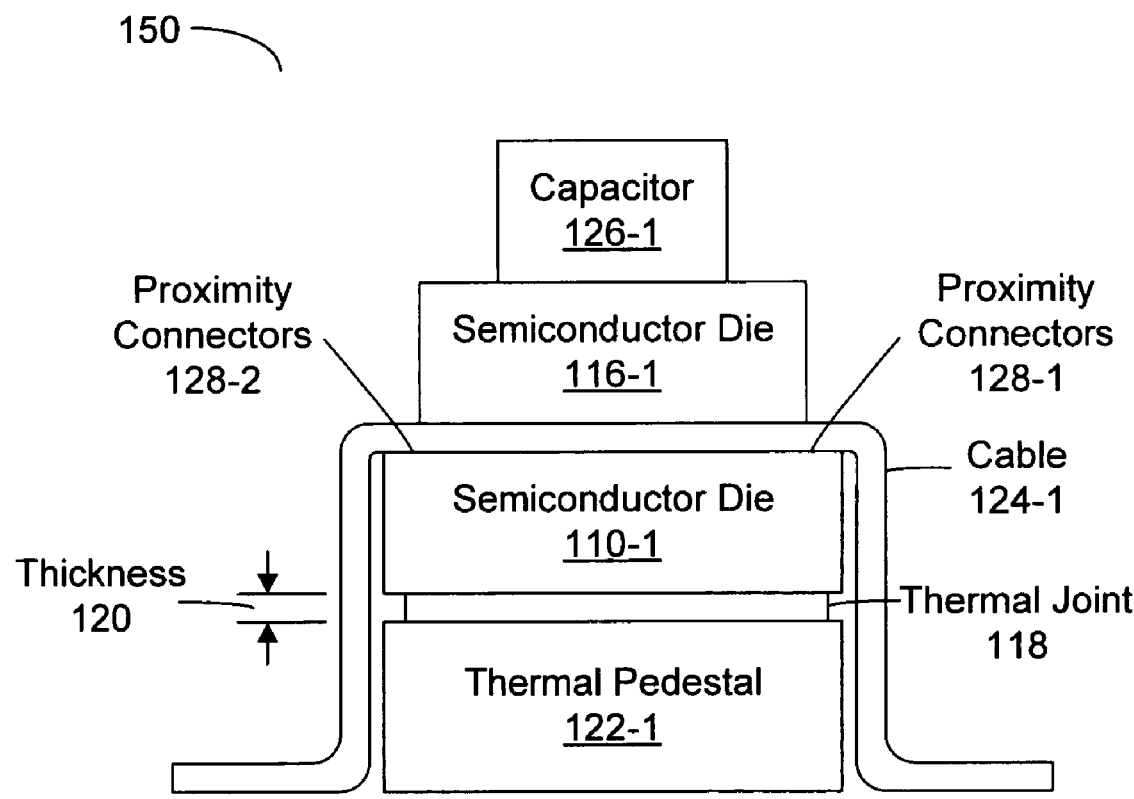
FIG. 1B is a block diagram illustrating an embodiment of a single-chip module.

FIG. 1B illustrates an embodiment of a single-chip module (SCM) 150. The SCM 150 includes a second semiconductor die 116 that is electrically and/or thermally coupled to the first surface of the first semiconductor die 110 via a coupling. The coupling has an average thickness (not shown). In the SCM 150, the capacitor 126 is coupled to the second semiconductor die 116. In embodiments such as the SCM 150, the first semiconductor die 110 is sometimes referred to as the carrier and the second semiconductor die 116 is sometimes referred to as the payload.

It should be understood that the SCM 100 and/or the SCM 150 are illustrative of the components and functionality of the SCM. In additional embodiments, the SCM 100 and/or the SCM 150 may include fewer or additional components. For example, there may be one or more additional payload semiconductor dies in the SCM 150. These additional payload semiconductor dies may be laminarly stacked on top of one another. In addition, two or more components may be combined into a single component. The cable 124 may be coupled to another location on the first semiconductor die 110. In some embodiments, the cable 124 may be coupled to the first semiconductor die 110 and/or the second semiconductor die 116.

FIG. 2 is a block diagram illustrating a cross-sectional view of an embodiment of a semiconductor die 210, such as the first semiconductor die 110 (FIGS. 1A and 1B) and/or the second semiconductor die 116 (FIG. 1B). The semiconductor die 210 has one or more layers 212 substantially symmetrically deposited on both a top and a bottom surface resulting in a substantially 4-fold symmetry. This symmetry provides self-balancing and may reduce some perturbations by providing an "anti-perturbation" that is substantially equal in magnitude and opposite in sign. In other embodiments of the SCMs and MCMs (described below in reference to FIGS. 4-8), self-balancing may be achieved without using such symmetric structures.

An example of such a perturbation is a quadrapole mechanical deviations (so-called potato chip deviations) of the semiconductor die 210 from a plane parallel to the top and/or bottom surface of the semiconductor die 210, i.e., in the out-of-plane dimension (Z) 214. Perturbation-induced quadrapole deviations of the semiconductor die 210 may result from non-uniform fabrication and/or thermal stress associated with different thermal expansion coefficients of materials (such as metals and/or dielectrics) in the layers 212. By applying similar layers 212 to both surfaces of the semiconductor die 210 the perturbation-induced quadrapole deviations may be reduced below a pre-determined value. This is discussed further below with reference to FIGS. 7 and 8.

Figure 3:
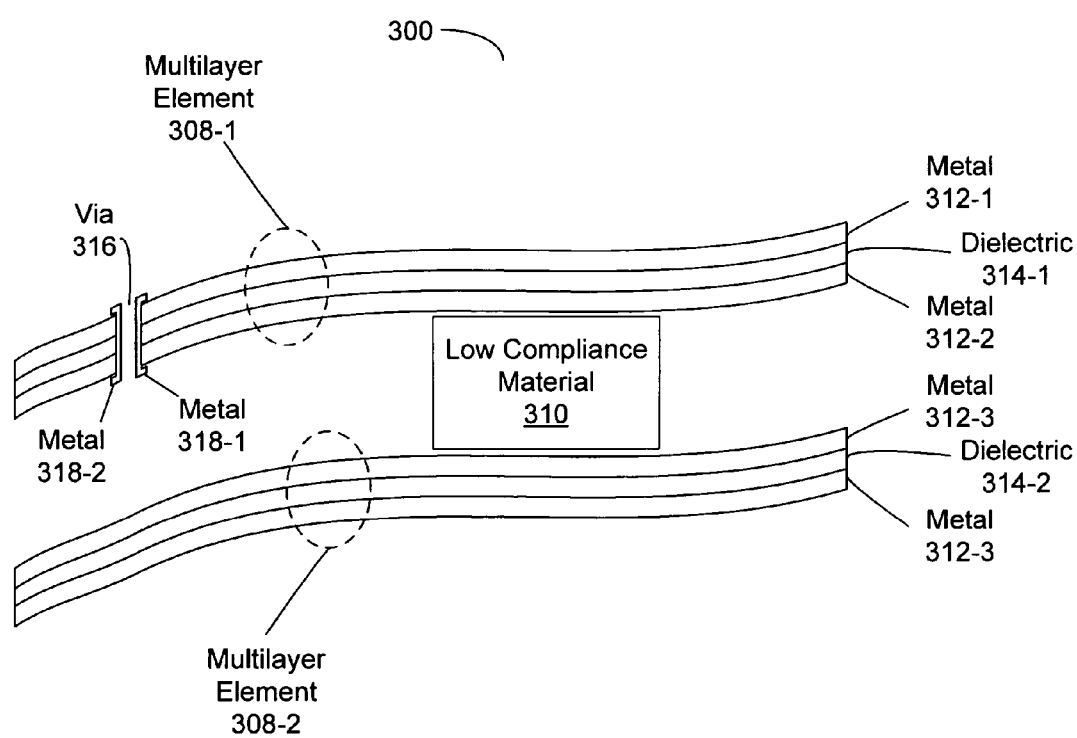
FIG. 3 is a block diagram illustrating an embodiment of a flexible cable.

FIG. 3 is a block diagram illustrating an embodiment of a flexible cable 300, such as the cable 124 (FIGS. 1A and 1B). The cable 300 includes at least two multilayer elements 308. Each multilayer element 308 has at least a first and a second metal layer 312, and a dielectric layer 314, such as polyimide. Each multilayer element 308 may constitute a transmission line.

At least the two multilayer elements 308 may be mechanically independent in at least a first section of the cable 300. In at least the first section, the cable 300 may have the flexibility compliance greater than the threshold value. In at least a second section of the cable 300, at least the two multilayer elements 308 may include stiffener elements resulting in the flexibility compliance that is less than the threshold value. In an additional section of the cable 300, which may not correspond to some or all of the second section, the multilayer elements 308 may be mechanically coupled to an optional low compliance material 310. The cable 300 may include one or more vias, such as via 316. The via 316 may pass through the multilayer element 308. Sides of the via 316 may be coated or plated with metal 318.

While the cable 300 includes two multilayer elements 308 and one via 316, other embodiments may include fewer or additional multilayer elements 308, and/or additional vias.

In an exemplary embodiment, the cable 300 and/or the cable 124 (FIGS. 1A and 1B) may use so-called rigid-flex printed wiring. This combines rigid printed wiring, henceforth referred to a rigid PW, and flexible printed wiring, henceforth referred to as flex PW. The cable 300 and/or the cable 124 (FIGS. 1A and 1B) may have a flat central area surrounded by four 'legs'. Each leg may have s-shaped bends. Each leg may end in a rigid 'foot'.

Rigid PW may include dielectric layers, such as the dielectric layers 314, with a stiffener, such as glass fibers. Rigid PW facilitates vias, such as the via 316, terminals and solder bonding. Rigid PW may be used at the central area and at each foot. The central area may be bonded to a semiconductor die, such as the first semiconductor die 110 (FIGS. 1A and 1B) and/or the second semiconductor die 116 (FIG. 1B), using a so-called C4-style array of tiny solder balls and underfill. This enables a dense array of bonds. As discussed further below with reference to FIG. 5, each foot may be bonded to components in the multi-chip module (MCM) using so-called PGA-style solder balls without any underfill. The PGA-style solder balls are larger than the C4-style solder balls. This enables a less dense but reworkable array of bonds.

In embodiments of the SCM, such as the SCM 150 (FIG. 1B), including the first semiconductor die 110 and the second semiconductor die 116, the rigid PW in the cable 124 (FIG. 1 B) may include terminals in different planes substantially parallel to the first surface of the first semiconductor die 110 (FIG. 1B). For example, some areas of the cable 124 (FIG. 1B) may include an extra-thick layer.

Flex PW may be used in the legs of the cable 300 and/or the cable 124 (FIGS. 1A and 1B). Several features make the flex PW have increased flexibility compliance. Notably, dielectric layers, such as the dielectric layers 314, may not include a stiffener, i.e., a material with low flexibility compliance, such as the glass fibers. In addition, in contrast with materials such as plywood that have reduced flexibility compliance due to multiple layers that are fully bonded together, flex PW is composed of subunits, such as the multilayer elements 308, without adhesion between the subunits. Where the flex PW meets the rigid PW these subunits are electrically connected in parallel.

Each flex PW leg may be s-shaped, with two smooth curves having a non-zero radius. As discussed further below in reference to FIG. 8, this provides some flexibility compliance in all six geometric degrees of freedom. In contrast, if the legs were z-shaped, with two sharp folds, the cable 300 and/or the cable 124 (FIGS. 1A and 1B) would have reduced flexibility compliance for rotations out of the plane defined by the first surface of the first semiconductor die 110 (FIGS. 1A and 1B).

In some embodiments, the flex PW may include one or more slits to increase the flexibility compliance of the cable 300 and/or the cable 124 (FIGS. 1A and 1B).

Multi-Chip Module

Figure 4:
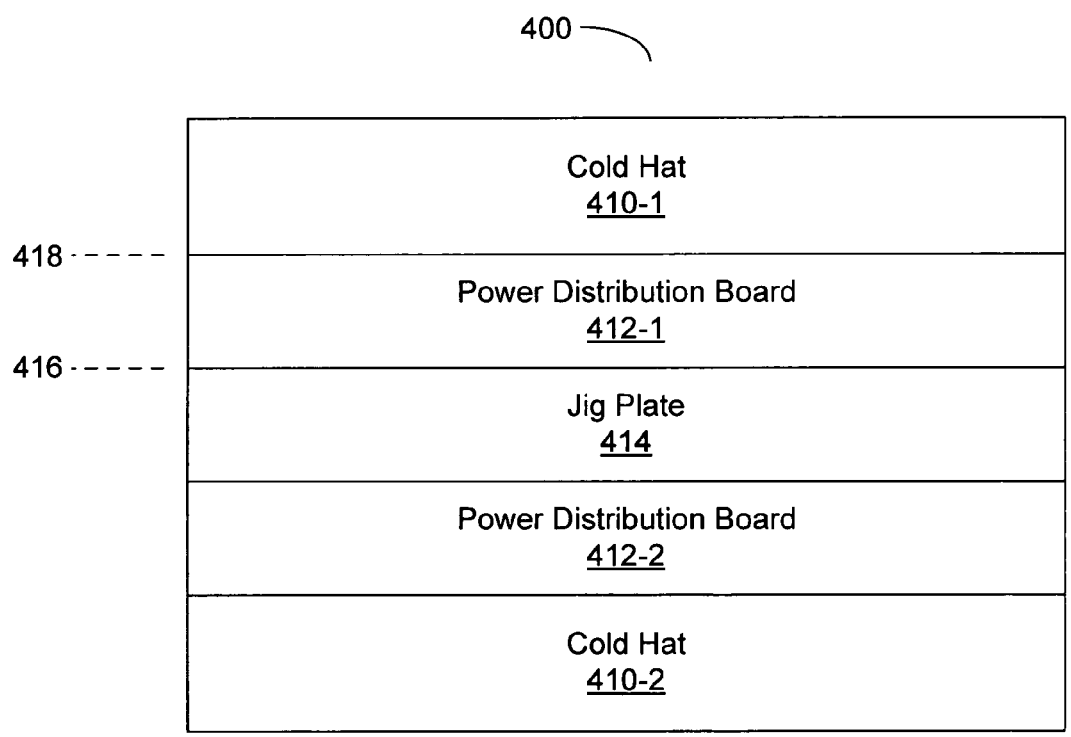
FIG. 4 is a block diagram illustrating a cross-sectional view of an embodiment of a multi-chip module.

FIG. 4 is a block diagram illustrating a cross-sectional view of an embodiment of a multi-chip module (MCM) 400. The MCM 400 includes two cold hats 410, two power distribution boards 412 and a jig plate 414. In some embodiments, the MCM 400 has congruent (symmetric) top and bottom components, allowing components to be shared. The functions of these components in the MCM 400 will be discussed further below with reference to FIGS. 5-8. Markers 416 and 418 indicate surfaces corresponding to views of the MCM 400 presented below with reference to FIGS. 6 and 8, respectively.

It should be understood that the MCM 400 is illustrative of the components and functionality of the MCM. In additional embodiments, the MCM 400 may include fewer or additional components. For example, the MCM 400 may have zero or two or more jig plates 414. Components may include fewer or additional features. Features of one component may be implemented on one or more additional components. In addition, two or more components may be combined into a single component.

Figure 5:
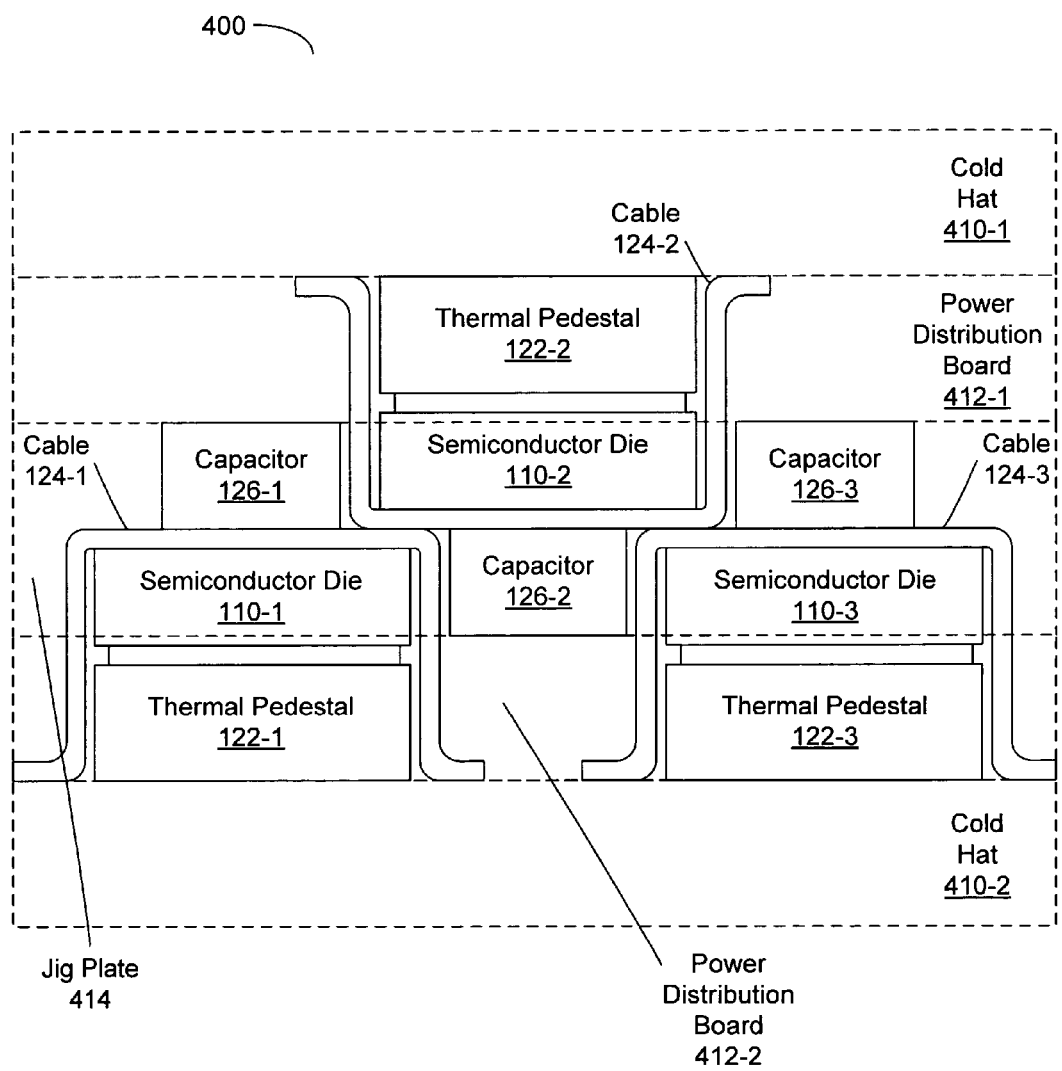
FIG. 5 is a block diagram illustrating a cross-sectional view of an embodiment of a multi-chip module.

FIG. 5 is a block diagram illustrating a cross-sectional view of an embodiment of the multi-chip module (MCM) 400. The MCM 400 includes a plurality of SCMs, such as the SCM 100 (FIG. 1A), arranged face-to-face with overlapping proximity connectors at one or more corners of the semiconductor dies in the SCMs. In other embodiments, where the proximity connectors are located elsewhere on and/or proximate to the first surface of the first semiconductor dies 110, and/or are coupled to the first semiconductor dies 110, the SCMs may be positioned accordingly in mounting structures in the MCM 400 to enable capacitive coupling between two or more overlapping proximity connectors.

While MCM 400 includes SCMs, such as the SCM 100 (FIG. 1A), in other embodiments the MCM 400 may include SCMs such as the SCM 150 (FIG. 11B).

While MCM 400 includes three SCMs, in other embodiments there may be fewer or more SCMs. In an exemplary embodiment, the MCM 400 includes 200 SCMs arranged in two layers (top and bottom), each having 10 rows and 10 columns. In other embodiments, one layer of SCMs may be arranged in an A×B array and another layer of SCMs may be arranged in a (A+E)×(B+F) array, where A and B are any natural number, and E and F are in the group 1, 0 and −1. Thus, the one layer may have 12×7 SCMs and the other layer may have 13×6 SCMs.

In addition, while the MCM 400 illustrates SCMs inserted from a top and a bottom surface of the MCM 400, in some embodiments SCMs may only be inserted into the MCM 400 from one surface or side. Other embodiments that deviate from the illustrated top-bottom symmetry include the operations of an out-of-plane dimension (Z) 214 (FIG. 2) flip, an out-of-plane dimension (Z) 214 (FIG. 2) rotation and/or offsets in the plane defined by the first surface of the first semiconductor die 110.

The MCM 400 includes unified sub-systems for power distribution, cooling and alignment. The sub-systems for power distribution and cooling may be self-adjusting (compliant or flexible) to allow the self-alignment described below with reference to FIG. 8. The sub-systems for alignment and power distribution may allow a cooling path with very low thermal resistance.

The power distribution boards 412 and the cables 124 couple electrical power from an external source to the SCMs. The power distribution boards 412 and the cables 124 may have very low resistance and inductance. For example, a DC resistance of 0.3 µΩ (with 10 kA of current) and an AC impedance less than 30 µΩ up to frequencies of a few GHz. In another example, a DC resistance less than 0.5 µΩ and an AC impedance less than 25 µΩ at frequencies up to 3 GHz. In some embodiments, the electrical power is distributed with high current and low voltage.

The power distribution boards 412 may include two or more parallel metal layers, such as copper, to distribute electrical power. The two or more parallel metal layers may be coupled to the cables 124 using a plurality of solder bonds having solder balls or metal-to-metal micro welds. As described previously, the coupling to the cables 124 may allow reworking of one or more of the SCMs. The coupling to the two or more parallel metal layers may provide sufficient metallic cross-section to achieve a very low resistance and inductance. In an exemplary embodiment, the power distribution boards 412 may have 14 layers of copper each having a thickness of 144 μm.

Positive currents and negative currents in the power distribution boards 412 may flow on closely adjacent metal layers. Two or more of these metal layers may form a transmission line with a very low AC impedance. As a consequence, the power distribution boards 412 may distribute a very large current with a uniform and steady voltage, with small DC voltage drops and with small AC noise, in spite of time-varying dissipation in each SCM.

In some embodiments, the power distribution boards 412 and the cables 124 may include auxiliary wiring to couple the monitoring signals from a perimeter of the MCM 400 to the SCMs independent of the plurality of proximity connectors 128 (FIGS. 1A and 1B) and their alignment. These monitoring signals may enable self-regulation of the MCM 400, including self-diagnosis (so-called JTAG signals), self-monitoring, and/or remote or self-control. In some embodiments, the monitoring signals have frequencies up to 10 MHz.

The first semiconductor die 110 and/or the second semiconductor die 116 (FIG. 1B) dissipate heat during electronic operations. The cooling sub-system may remove this heat through a small temperature difference between the temperature at the first semiconductor die 110 and/or the second semiconductor die 116 (FIG. 1B) and an inlet cooling temperature.

Heat conducts through the thermal joint 118 (FIGS. 1A and 1B), and the thermal pedestal 122. The thermal pedestal 122 is coupled to cooling components such as the cold hats 410 via a thermal bond. In some embodiments, the thermal bond may be similar or identical to the thermal joint 118 (FIGS. 1A and 1B). In some embodiments, the cold hats 410 may include one or more cold sheets and flowing coolant. Suitable materials for the one or more cold sheets may include copper or copper alloys, such as copper-silicon-chromium or copper-beryllium. An embodiment of the thermal structures is described in U.S. Pat. No. 5,388,635, the contents of which are herewith incorporated by reference.

The flowing cooling may be a single-phase liquid coolant, such as cool water, oils, hydro-carbons and/or fluro-carbons, or a phase-change coolant, such as organic solvents, hydro-carbons, fluro-carbons, liquid/vapor refrigerants and/or liquid/vapor water in a heat pipe. Alternatively, gas coolants may be used, such as air and/or helium. Cooling may be implemented by thermo-mechanical or thermoelectric techniques. In an exemplary embodiment, single-phase forced convention using cool water and a small hydrostatic pressure may be used. In other embodiments, piston cooling or direct impingement cooling may be used. In direct impingement cooling, the cold hat 410 includes an array of nozzles. Coolant squirts through the array of nozzles onto the outer surface of each SCM in the MCM 400. In an exemplary embodiment, the MCM 400 has a temperature increase of 75 C at 120 W/cm$^2$ with 10 kW dissipated in the MCM 400.

Figure 6:
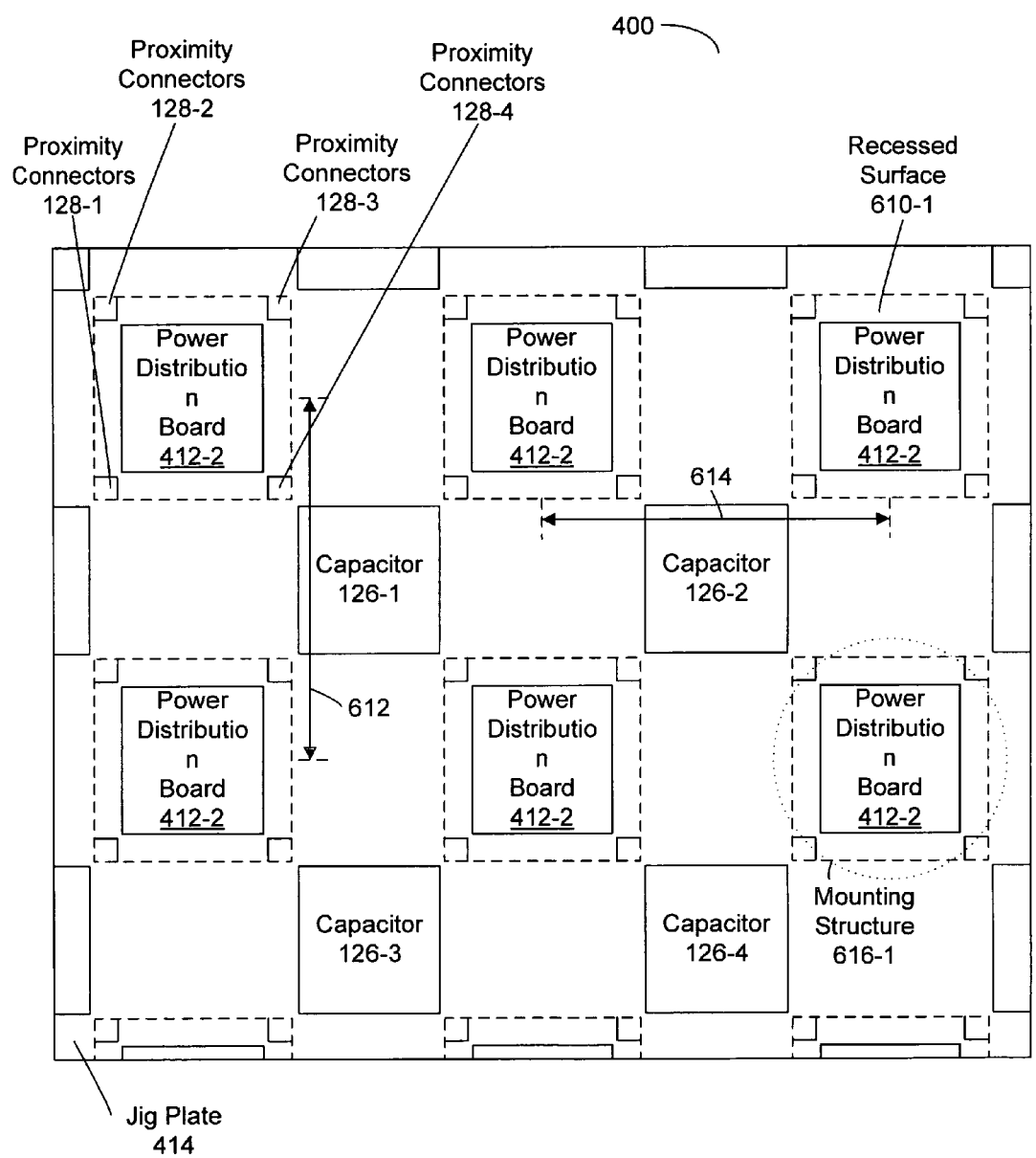
FIG. 6 is a block diagram illustrating a top view of an embodiment of a multi-chip module.

FIG. 6 is a block diagram illustrating a top view of an embodiment of the MCM 400, as seen from the surface indicated by marker 416 (FIG. 4). The jig plate 414 includes multiple instances of mounting structures 616 into which SCMs may be inserted (these SCMs are not illustrated in FIG. 6 for clarity). In some embodiments, the SCMs may be removeably inserted into the mounting structures 616. The mounting structures 616 have a first pitch 612 in a first in-plane dimension (X) and a second pitch 614 in a second in-plane dimension (Y).

Each mounting structure 616, such as mounting structure 616-1, has a recessed surface 610, such as recessed surface 610-1, and a central opening bounded below by power distribution board 412-2. These openings, also referred to as seats, correspond to the decoupling capacitors 126 (FIG. 1A, 1B and 5) in the SCMs, and thereby provide long-range coarse alignment between the SCMs. Each recessed surface 610 includes openings through which the plurality of proximity connectors 128 proximate to the first surface of the first semiconductor die 110 (FIGS. 1A, 1B and 5) in the SCMs inserted from an opposite side of the MCM 400 can be accessed. The decoupling capacitors 126 in these SCMs are visible in the jig plate 414. In those embodiments where the SCMs include the plurality of proximity connectors 128 located substantially in one or more corners of the first semiconductor die 110 (FIG. 1A and FIG. 1B), the jig plate 414 illustrated in FIG. 6 allows adjacent SCMs to be coarsely aligned such that there is overlap between two or more of the plurality of proximity connectors 128. In this way, two or more adjacent SCMs may communicate data signals using two or more of the plurality of proximity connectors 128.

In some embodiments, there may be direct contact between the plurality of proximity connectors 128 on adjacent SCMs. In some embodiments, the respective SCM may contact the recessed surface 610, which provides a global out-of-plane dimension (Z) 214 (FIG. 2) reference in the MCM 400, i.e., the recessed surface may function as a stop. However, this may result in geometric redundancy, which may result in precision challenges. In some embodiments, therefore, SCMs inserted on one side of the MCM 400 are out-of-plane dimension (Z) 214 (FIG. 2) aligned by the jig plate 414. SCMs inserted from an opposite side of the MCM 400 may be aligned with corners of adjacent SCMs (inserted from the other side of the MCM 400) but may not be directly aligned by the jig plate 414. These embodiments provide a partial global out-of-plane dimension (Z) 214 (FIG. 2) reference, and partially mitigates geometric redundancy and precision challenges. These embodiments, however, may be vulnerable to perturbation-induced quadrapole distortions of one or more of the SCMs. As a consequence, these embodiments may impose a tolerance limit on this perturbation.

In some embodiments, the jig plate 414 may be fabricated from silicon or other covalent crystal wafers using micro electromechanical systems (MEMS) techniques. Silicon has suitable elastic properties and is not subject to inelastic (plastic) deformation. Silicon may, however, be vulnerable to cracking due to excessive stress. Structures that concentrate stress, such as sharp corners and narrow necks, may be undesirable. The jig plate 414 and the SCMs may, therefore, have one or more chamfered or rounded corners.

In other embodiments, the jig plate 414 may include metal or glass. Fabrication techniques include liquid chemical machining, laser processing and/or reactive ion etching. A metal jig plate 414 may allow fabrication of a jig plate 414 that is larger than a current tooling limit for silicon wafers. Metal may also be resistant to in-plane stresses relative to silicon. Depending on a composition, however, metal may be vulnerable to inelastic deformation, particularly in the out-of-plane dimension (Z) 214 (FIG. 2). In addition, wet-etching of metals may provide isotropic etching. This may result in rounded edges and fabrication tolerances that are proportional to a thickness of the jig plate 414.

In some embodiments, the pitches 612 and 614 may be equal and the SCMs may have a square shape in the plane of FIG. 6. Other embodiments, allow the pitch 612 to be different from the pitch 614 and/or the SCMs may have a rectangular shape in the plane of FIG. 6. In addition, in some embodiments a respective row may have a different pitch 612 than one or more additional rows, and/or a respective column may have a different pitch 614 than one or more additional columns. The pitch 612 is common, however, to the respective-row, and the pitch 614 is common to the respective column.

While the MCM 400 illustrated in FIG. 6 has one central jig plate 414, in other embodiments there may be zero or two or more jig plates 414. In one such embodiment, the MCM has a top half and a bottom half. Each half has a jig plate, such as the jig plate 414. For example, there may be a top cold hat 410 (FIG. 4), a top power distribution board 412 (FIG. 4), a top jig plate, optional alignment hardware, a bottom jig plate, a bottom power distribution board 412 (FIG. 4) and a bottom cold hat 410 (FIG. 4). Each jig plate may assist in aligning the SCMs in a respective half of the MCM. In each respective half of the MCM, the structures may be largely self-aligned, self-adjusting and/or self-balancing. Mating the two halves, however, may depend on mechanical precision.

In another embodiment, the MCM has a top half and a bottom half. Each half has a jig plate, such as the jig plate 414. Each SCMs in the top half may be tightly aligned by the top jig plate. In the bottom half, however, each SCM may be less tightly aligned by the bottom jig plate. When these two halves are mated together, the bottom half may be self-aligned against the top jig plate. In addition, SCMs in the bottom half may be slightly self-aligned against the top jig plate.

In another embodiment, the jig plate may be eliminated. Instead, the first semiconductor die 110 (FIGS. 1A, 1B and 5) and/or the second semiconductor die 116 (FIG. 1B) in each SCM is directly aligned with four corner-adjacent semiconductor dies in adjacent SCMs. For example, there may be an alignment hole near a corner of the first semiconductor die 110 (FIGS. 1A, 1B and 5) in each SCM. An alignment pin may link together the adjacent semiconductor dies. This embodiment, however, may require precise fabrication and assembly. The SCMs are located in a topographically two-dimensional array. Corner adjacent linkage leads to topographic loops from one semiconductor die through corner-adjacent semiconductor dies and back to the original semiconductor die. Thus, there is geometric redundancy around this loop. This may result in an increased accumulated tolerance around this loop.

In another embodiment, there may be a plurality of jig plates that are joined together in a plane parallel to the first surface of the first semiconductor die 110 (FIGS. 1A, 1B and 5).

While the MCM 400 illustrated in FIG. 6 has the SCMs arranged in a square checker-board pattern, where a perimeter of the SCM array is parallel to edges of each SCM, other patterns may be used. For example, in the event of a communication failure in a network of corner-connected SCMs arranged in a square checker-board pattern, a rerouting of data signals may not be possible at certain locations. When a diamond checker-board pattern is used, where the perimeter of the SCM array is diagonal to edges of each SCM, such rerouting of data signals in the event of a failure of any corner-adjacent pair is possible.

Other patterns, therefore, may include the diamond checker-board pattern or combinations of the square checker-board pattern and the diamond checker-board pattern. For example, in one layer of SCMs in the MCM 400 the perimeter of the SCM array may be diagonal to edges of each SCM, and in another layer of SCMs the perimeter of the SCM array may be parallel to edges of each SCM. In these embodiments, the corners of the first semiconductor die 110 (FIGS. 1A, 1B and 5) in the one layer may overlap an edge-center of the first semiconductor die 110 (FIGS. 1A, 1B and 5) in the other layer. And the corners of the first semiconductor die 110 (FIGS. 1A, 1B and 5) in the other layer may overlap an edge-center of the first semiconductor die 110 (FIGS. 1A, 1B and 5) in the one layer. In each layer, the SCMs are located in a half-populated network. By combining both layers, the SCMs are located in a fully populated network.

To provide proper alignment between the SCMs in one or more of the six geometric degrees of freedom, the MCM 400 includes components and structures that enable self-alignment and/or self-adjustment. As discussed further below with reference to FIG. 7, this may include allowing small free movement of each SCM plus a means, such as a spring, to apply a controlling or restoring force. When each SCM is assembled into the MCM 400, these components gently position each SCM. These components operate during initial assembly and throughout the life of the MCM 400. They help reduce initial perturbations associated with fabrication and assembly tolerances, as well as cyclic perturbations, such as distortions from thermal or mechanical changes.

The self-alignment and/or self-adjustment by components in the MCM 400 may reduce the need for precise fabrication and precise assembly of the MCM 400, and may reduce sensitivity to operating perturbations. This may reduce costs associated with the MCM 400 and may facilitate fabrication and assembly.

Figure 7:
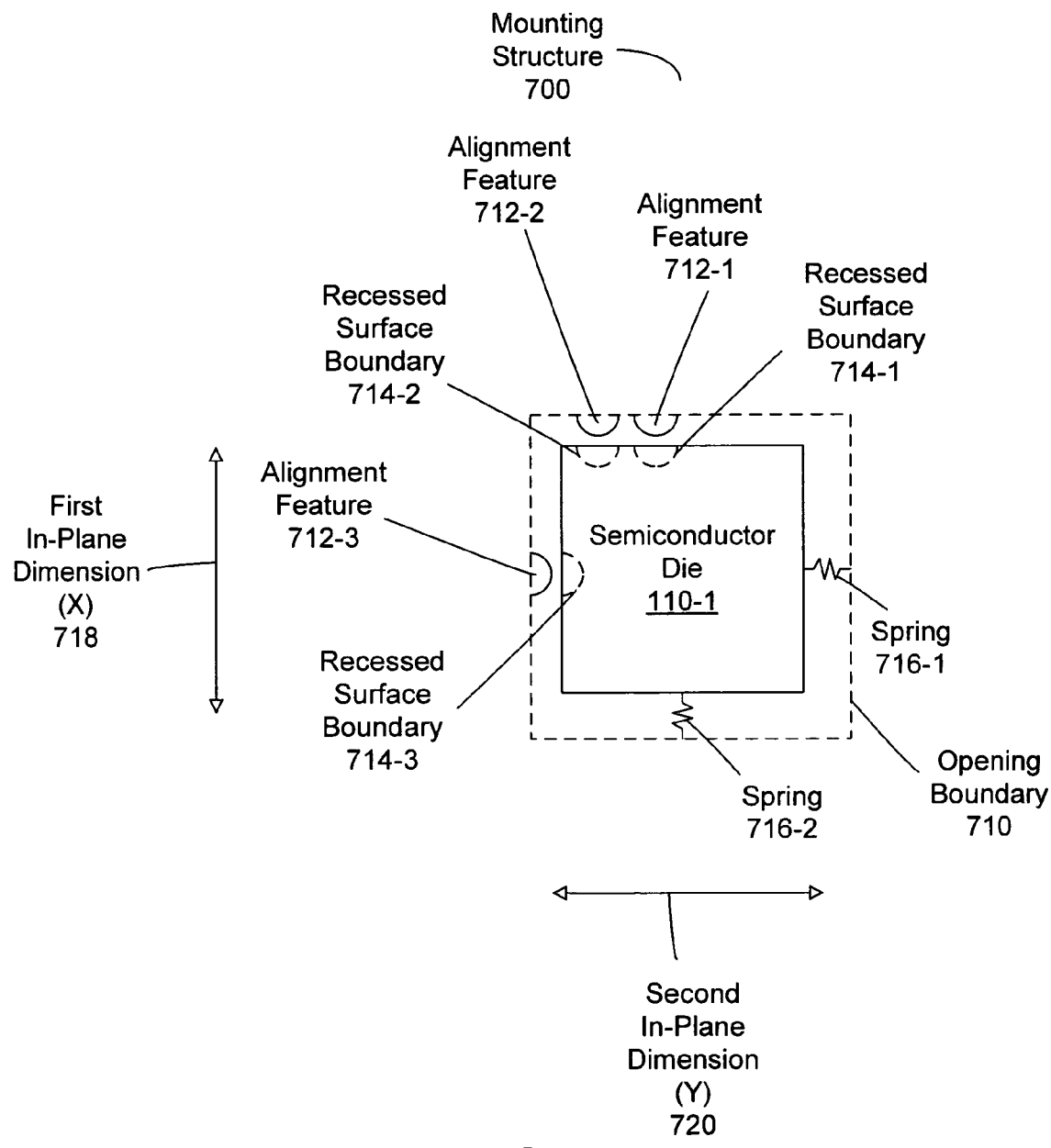
FIG. 7 is a block diagram illustrating a top view of an embodiment of a mounting structure in the jig plate.

FIG. 7 is a block diagram illustrating a top view of an embodiment of a mounting structure 700 in the jig plate 414 (FIGS. 4, 5 and 6). The first semiconductor die 110 includes three or more recessed surface boundaries 714. The recessed surface boundaries 714 may be defined using photolithographic techniques and/or chemical machining techniques, such as those used in processing of MEMS. The recessed surface boundaries 714 may be precisely defined. The first semiconductor die 110 may include optical features (not shown) to guide alignment. In some embodiments, additional flat edges (not shown) may be defined on the first semiconductor die 110 to assist alignment. In other embodiments, recessed surface boundaries and/or additional flat edges may be defined on the second semiconductor die 116 (FIG. 1B).

The recessed surface boundaries 714 correspond to three or more alignment features 712 on an inner surface of an opening, defined by an opening boundary 710, in an instance of the mounting structure 700 in the jig plate 414 (FIGS. 4, 5 and 6). The mounting structure 700 may correspond to the mounting structure 616-1 (FIG. 6). The recessed surface boundaries 714 and the alignment features 712 may be convex and/or concave shapes. In an exemplary embodiment they are half cylinders. The opening corresponds to the decoupling capacitor 126 (FIG. 1A, 1B, 5 and 6) in the respective SCM. In alternate embodiments, the alignment features 712 may be placed on another surface in the jig plate 414 (FIG. 4, 5 and 6).

The alignment features 712 may be precisely defined, for example, using photolithographic techniques and/or chemical machining techniques. Such precision may be needed since edges of the semiconductor die 110, which may be defined when the semiconductor die 110 is singulated or diced from a large wafer during a scribing process, may not be well suited for accurate alignment.

In conjunction with the alignment features 712 and the recessed surface boundaries 714, springs 716 may position the first semiconductor die 110 such that misalignment in a first in-plane dimension (X) 718 (of the first surface of the semiconductor die 110) and/or a second in-plane dimension (Y) 720 is reduced, thereby enabling proximity communication of data signals. In some embodiments, the jig plate 414 (FIGS. 4, 5 and 6) may also improve alignment in the out-of-plane dimension (Z) 214 (FIG. 2). Simultaneously, the structures illustrated in FIG. 7 may allow small free movement of the various components to relax residual stresses and/or perturbations.

In some embodiments, the SCMs may also utilize electronic steering in the plurality of proximity connectors 128 (FIGS. 1A, 1B and 6) to further align two or more of the plurality of proximity connectors 128 (FIGS. 1A, 1B and 6). In electronic steering, active electronics determine a relative alignment of the plurality of proximity connectors 128 (FIGS. 1A, 1B and 6) on two adjacent SCMs and data signals may be rerouted to those pads which are most closely aligned.

The coarse and fine adjustments provided by the recessed surface boundaries 714, the alignment features 712 and the springs 716 illustrate one of the redundant and nested structures provided by the MCM 400 (FIGS. 4, 5 and 6). These structures provide an initial or starting alignment accuracy, as well as a tighter final accuracy. Redundancy in these nested structures may reduce an impact of potentially severe perturbations, including unanticipated ones, that might otherwise disable communication using the proximity connectors.

The nested structures enable overlap between two or more of the plurality of proximity connectors 128 (FIGS. 1A, 1B and 6) on two or more adjacent SCMs. The respective SCM may positioned in the MCM 400 (FIGS. 4, 5 and 6) relative to additional proximity connectors 128 (FIGS. 1A, 1B and 6) on adjacent SCMs with a deviation in the first in-plane dimension (X) 718 that is less than one half of a first pitch of at least a subset of the plurality of the proximity connectors 128 (FIGS. 1A, 1B and 6) along the first in-plane dimension (X) 718. In addition, respective SCM may be positioned such that the deviation in the out-of-plane dimension (Z) 214 (FIG. 2) is less than the pre-determined value. In some embodiments, one half of the first pitch in the first in-plane dimension (X) 718 is 25 µm and the pre-determined value is 5 µm.

In embodiments where a subset of the plurality of proximity connectors 128 (FIGS. 1A, 1B and 6) have a second pitch in the second in-plane dimension (Y) 720, the respective SCM may positioned in the MCM 400 (FIGS. 4, 5 and 6) relative to additional proximity connectors 128 (FIGS. 1A, 1B and 6) on adjacent SCMs with a deviation in the second in-plane dimension (Y) 718 that is less than one half of a second pitch. In some embodiments, one half of the second pitch in the second in-plane dimension (Y) 720 is 25 µm.

While FIG. 7 illustrates an embodiment of recessed surfaces 714 and alignment features 712, there are numerous alternate embodiments that fulfill align adjacent components. Examples include mating of a pair of flat surfaces and accurate holes in adjacent components in conjunction with one or more alignment pins. Embodiments of these and other structures, including those illustrated in FIG. 7, may incorporate a taper or chamfer to provide some self-alignment when components are assembled. In addition, while the mounting structure 700 illustrates alignment features 712 on the jig plate 414 and recessed surface boundaries 714 on the first semiconductor die 110, in other embodiments the alignment features 712 may be on the first semiconductor die 110 and the recessed surface boundaries 714 may be on the jig plate 414.

Figure 8:
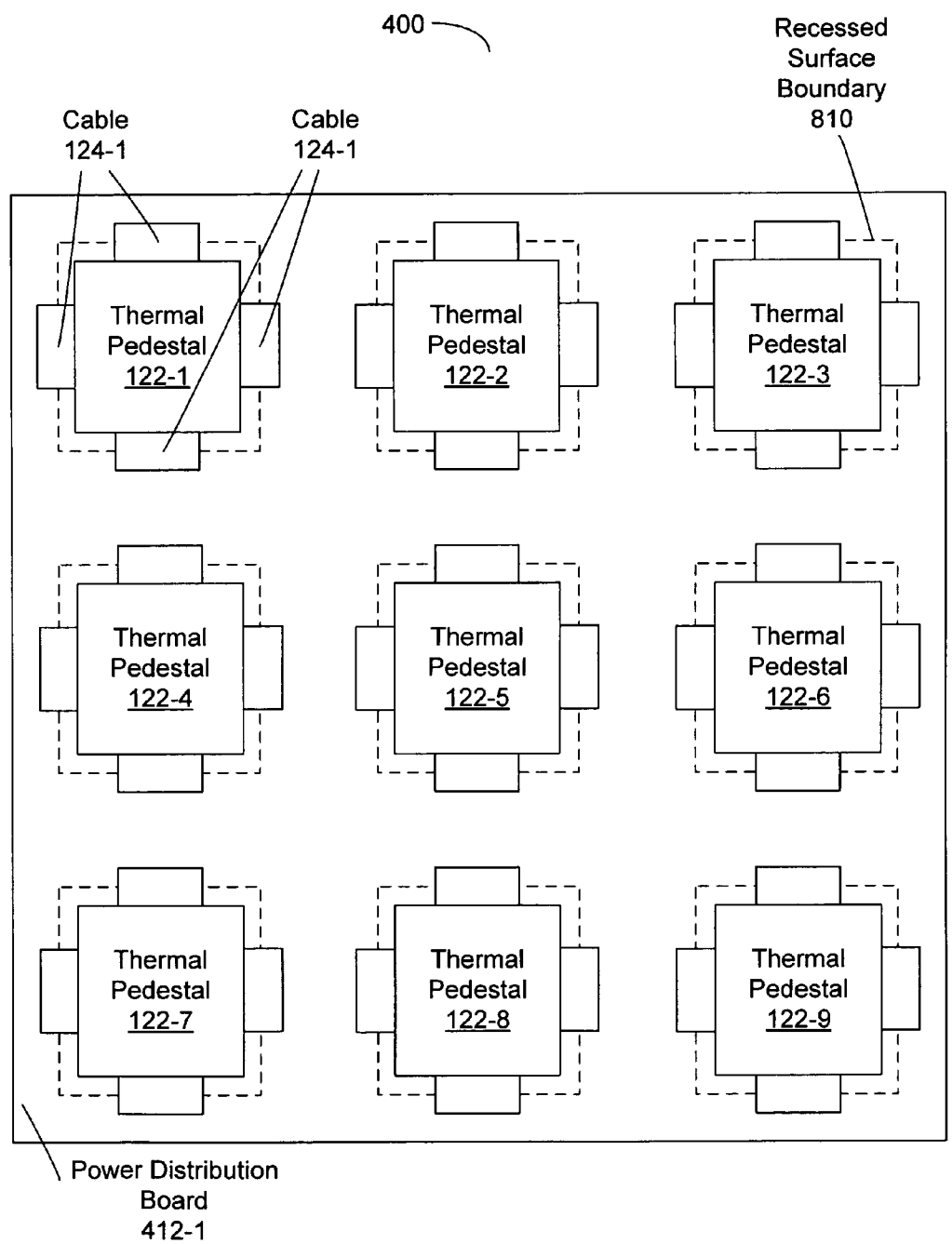
FIG. 8 is a block diagram illustrating a top view of an embodiment of a multi-chip module.

FIG. 8 is a block diagram illustrating a top view of an embodiment of the multi-chip module (MCM) 400, as seen from the surface indicated by marker 418 (FIG. 4). Power distribution board 412-1 includes multiple instances of mounting structures for SCMs. The SCMs are inserted into recessed surfaces, as illustrated by recessed surface boundaries, such as the recessed surface boundary 810. Only the thermal pedestals 122 and the cable 124 in the SCMs are visible. The recessed surface boundaries include sufficient margin to allow self-adjustment and self-alignment of the SCMs. Note the four-fold symmetry of the cable 124, which are bonded to the outside of the power distribution board 412-1 in this embodiment. In other embodiments, the cable 124 may be bonded to the inside of the power distribution boards 412. In some embodiments, a thickness of the thermal pedestals 122 may be selected such that the thermal pedestals 122 are substantially co-planar with the power distribution boards 412.

To allow small free movements of SCMs in the mounting structures, the cable 124 (FIGS. 1A, 1B and 5) may be at least slightly flexible/compliant in each of the six degrees of freedom thereby allowing self-adjustment to enable self-alignment, as discussed previously. In addition, since the SCMs in the power distribution board 412-1 may not be sufficiently coplanar, cooling components, such as the cold hats 410 (FIGS. 4 and 5), may also be slightly self-adjusting, i.e., flexible/compliant and/or stretchable. For example, the one or more cold sheets in the cold hats 410 (FIGS. 4 and 5) may be thin and somewhat bendable. This may provide moderate restoring forces on the SCMs. In addition, the thermal bond between a first cold sheet and the thermal pedestal 122 may also be flexible/compliant. In this way, self-adjustment and self-alignment may enable the deviation in the out-of-plane dimension (Z) 214 (FIG. 2) to be less than the pre-determined value.

While the self-alignment, self-adjusting and self-balancing in the MCM 400 have been illustrated with passive components and structures, in other embodiments active components and/or structures may be used. For example, a closed feedback loop may measure a distortion or perturbation and drive an actuator, which counteracts or reduces the distortion. The closed feedback loop may include an amplifier and an inverter.

In addition, the embodiments disclosed may be generalized to other connectors between overlapped areas on adjacent SCMs. One embodiment uses magnetic proximity connectors, where data signals are communicated magnetically between terminals on closely adjacent semiconductor dies. Another embodiment uses optical proximity connectors, where data signals are communicated optically between terminals on adjacent semiconductor dies. Another embodiment may couple connectors in adjacent semiconductor dies using an array of tiny solder balls.

Rework and Burn-In Testing

In existing MCMs, where semiconductor dies and/or chips are bonded, for example, using solder balls, to a mother board, it may be difficult to rework one or more of the semiconductor dies and/or chips. As described previously, the coupling of the SCMs, such as the SCM 100 (FIG. 1A) and/or the SCM 150 (FIG. 1B) to the MCM, such as the MCM 400 (FIGS. 4, 5, 6, and 8) may enable reworking of the MCM. For example, the cable 124 (FIGS. 1A, 1B, 5 and 8) may be decoupled from the power distribution boards 412 (FIGS. 4, 5 and 8).

Figure 9:
FIG. 9 is a flow chart illustrating an embodiment of a process for reworking a multi-chip module.

FIG. 9 is a flow chart illustrating an embodiment of a process 900 for reworking a MCM. One or more SCMs are removed from a MCM (910). One or more SCMs are replaceably attached to the MCM (912). In some embodiments, the process may include fewer or additional operations, an order of the operations may be changed and/or two or more operations may be combined.

It may also be difficult to fully test existing semiconductor dies and/or chips prior to assembly in an MCM. Typically, existing semiconductor dies and/or chips are only partly tested prior to assembly. The SCMs, such as the SCM 100 (FIG. 1A) and/or the SCM 150 (FIG. 1B), may be fully tested prior to assembly in the MCM, such as the MCM 400 (FIGS. 4, 5, 6 and 8).

Figure 10:
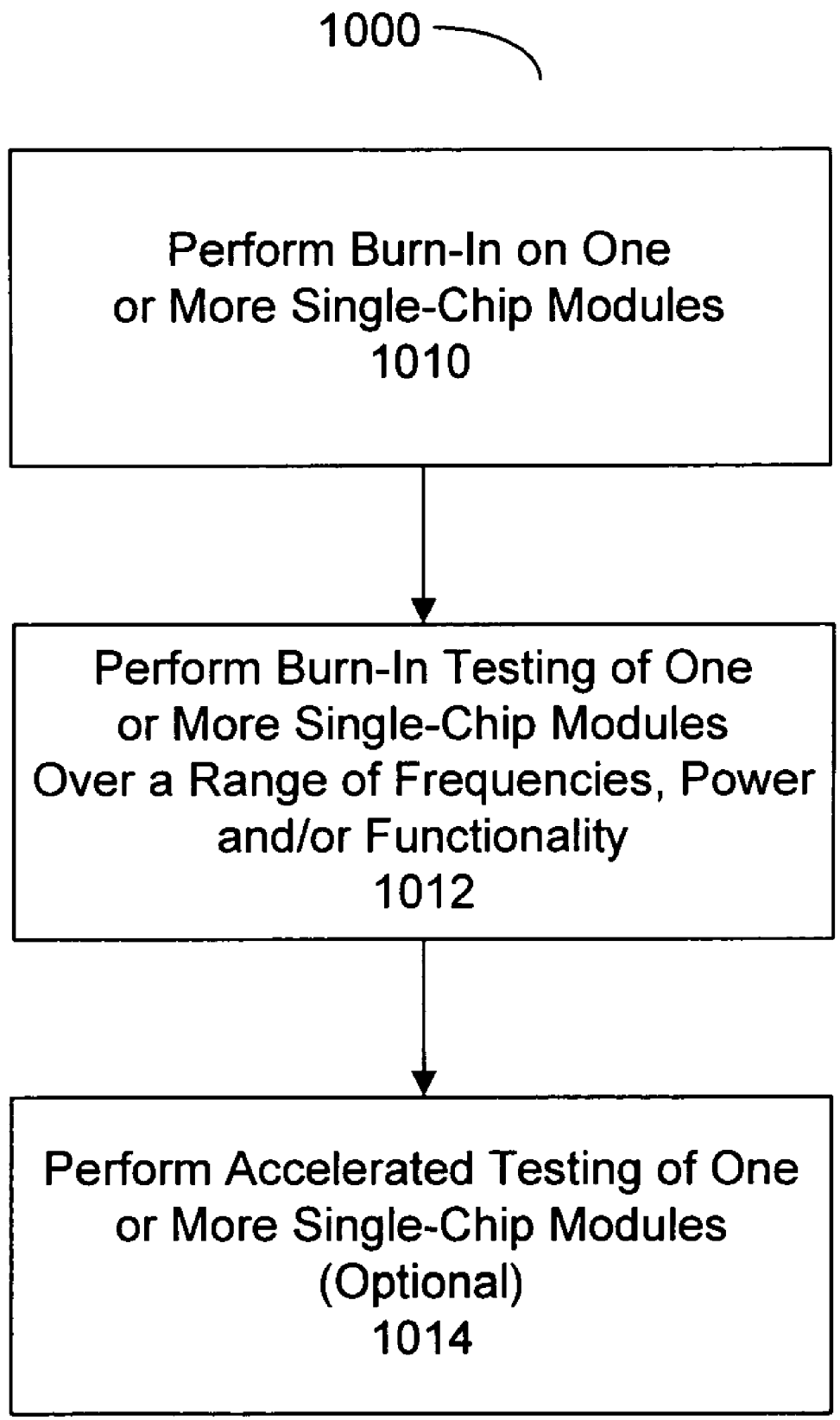
FIG. 10 is a flow chart illustrating an embodiment of a process for testing of one or more single-chip modules.

FIG. 10 is a flow chart illustrating an embodiment of a process 1000 for testing of one or more SCMs. Burn-in is performed on the one or more SCMs (1010). Testing is performed on the one or more SCMs over a range of frequencies, power and/or functionality (1012). Optional accelerated testing is performed on the one or more SCMs (1014). In this way, full testing of the one or more SCMs may occur prior to assembly of the MCM, allowing the one or more SCMs to be accepted or rejected. In some embodiments, the process may include fewer or additional operations, an order of the operations may be changed and/or two or more operations may be combined.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A module, comprising:
    a semiconductor die having a first surface and a second surface,
    wherein the semiconductor die is configured to communicate by capacitive coupling using one or more of a plurality of proximity connectors coupled to the semiconductor die; and
    a cable coupled to the semiconductor die configured to couple power signals to the semiconductor die,
    wherein a flexibility compliance of at least one section of the cable is greater than a threshold value and wherein the flexibility compliance of at least another section of the cable is less than the threshold value thereby allowing the module to be positioned in a mounting structure.

2. The module of claim 1, wherein the semiconductor die has the plurality of proximity connectors proximate to the first surface and wherein one or more of the plurality of proximity connectors enable communication of data signals by capacitive coupling.

3. The module of claim 1, wherein the cable is coupled to the first surface of the semiconductor die.

4. The module of claim 3, further comprising a capacitor coupled to the cable, such that the cable is sandwiched between the capacitor and the first surface of the semiconductor die.

5. The module of claim 4, wherein a capacitance C between the capacitor and a ground and an inductance L of the cable may result in an LC time constant substantially less than 1 ns.

6. The module of claim 1, wherein the cable includes at least two multilayer elements, each multilayer element having a first metal layer, a dielectric layer and a second metal layer, and wherein each multilayer element comprises a transmission line.

7. The module of claim 6, wherein at least the two multilayer elements are mechanically independent in at least the one section of the cable having the flexibility compliance greater than the threshold value.

8. The module of claim 6, wherein at least the two multilayer elements include stiffener elements in at least another section of the cable resulting in the flexibility compliance that is less than the threshold value.

9. The module of claim 1, wherein the cable couples monitoring signals having frequencies up to 10 MHz to the module.

10. The module of claim 1, wherein the cable has a DC resistance less than 0.5 $\mu\Omega$ and an AC impedance less than 25 $\mu\Omega$ at frequencies up to 3 GHz.

11. The module of claim 1, wherein the semiconductor die includes at least three lithographically defined alignment features, the alignment features corresponding to the mounting structure such that the module may be positioned in the mounting structure relative to additional proximity connectors with a deviation in a first dimension in a plane of the first surface of the semiconductor die that is less than one half of a pitch of at least a subset of the plurality of the proximity connectors along the first dimension, and the deviation in a second dimension perpendicular to the plane of the first surface of the semiconductor die that is less than a pre-determined value.

12. The module of claim 11, wherein one half of the pitch in the first dimension is 25 $\mu$m and the pre-determined value is 5 $\mu$m.

13. The module of claim 12, wherein the module may be further positioning in the mounting structure relative to the additional proximity connectors such that the deviation in a third dimension in the plane of the first surface of the semiconductor die is less than one half of the pitch of at least the subset of the plurality of the proximity connectors along the third dimension.

14. The module of claim 13, wherein one half of the pitch in the third dimension is 25 $\mu$m.

15. The module of claim 1, further comprising a pedestal coupled to the second surface of the semiconductor die via a thermal joint.

16. The module of claim 15, wherein the thermal joint includes a material selected from the group consisting of solder, a shearable layer of oil, a thermal paste and a coating that reduces static friction.

17. The module of claim 1, wherein the semiconductor die has substantially symmetric layers deposited on the first surface and the second surface resulting in a substantially 4-fold symmetry that reduces perturbation-induced quadrapole mechanical deviations of the semiconductor die from a plane parallel to the first surface below a pre-determined value.

18. A module, comprising:
    a first semiconductor die having a first surface and a second surface,
    wherein the first semiconductor die is configured to communicate by capacitive coupling using one or more of a plurality of proximity connectors;
    a cable coupled to the first surface of the semiconductor die configured to couple power signals to the first semiconductor die; and
    a second semiconductor die electrically and thermally coupled to the first surface of the first semiconductor die,
    wherein a flexibility compliance of at least one section of the cable is greater than a threshold value and wherein the flexibility compliance of at least another section of the cable is less than the threshold value thereby allowing the module to be positioned in a mounting structure.

19. The module of claim 18, wherein the first semiconductor die has the plurality of proximity connectors proximate to the first surface and wherein one or more of the plurality of proximity connectors enable communication of data signals by capacitive coupling.

20. The module of claim 18, wherein the second semiconductor die has substantially symmetric layers deposited on a top and a bottom surface resulting in a substantially 4-fold symmetry that reduces perturbation-induced quadrapole mechanical deviations of the second semiconductor die from a plane parallel to the first surface of the first semiconductor die below a pre-determined value.

21. A module, comprising:
   A semiconductor means having a first surface and a second surface,
   wherein the semiconductor means is for communicating by capacitive coupling using one or more of a plurality of proximity connectors; and
   an interconnect means coupled to the semiconductor means for coupling power signals to the semiconductor means,
   wherein a flexibility compliance of at least one section of the interconnect means is greater than a threshold value and wherein the flexibility compliance of at least another section of the cable is less than the threshold value thereby allowing the module to be positioned in a mounting mechanism.

* * * * *